(12) United States Patent
Callegari et al.

(10) Patent No.: US 7,833,849 B2
(45) Date of Patent: Nov. 16, 2010

(54) METHOD OF FABRICATING A SEMICONDUCTOR STRUCTURE INCLUDING ONE DEVICE REGION HAVING A METAL GATE ELECTRODE LOCATED ATOP A THINNED POLYGATE ELECTRODE

(75) Inventors: Alessandro C. Callegari, Yorktown Heights, NY (US); Tze-Chiang Chen, Yorktown Heights, NY (US); Michael P. Chudzik, Danbury, CT (US); Bruce B. Doris, Brewster, NY (US); Young-Hee Kim, Yorktown Heights, NY (US); Vijay Narayanan, New York, NY (US); Vamsi K. Paruchuri, New York, NY (US); Michelle L. Steen, Danbury, CT (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 639 days.

(21) Appl. No.: 11/323,564

(22) Filed: Dec. 30, 2005

(65) Prior Publication Data
US 2007/0152273 A1   Jul. 5, 2007

(51) Int. Cl.
*H01L 21/62* (2006.01)
(52) U.S. Cl. .............................. 438/158; 257/E21.635
(58) Field of Classification Search .................. 257/369, 257/410, E29.242, E21.635, E21.638, E21.639; 438/153, 188
See application file for complete search history.

(56) References Cited

U.S. PATENT DOCUMENTS

| 6,087,225 | A  | * | 7/2000 | Bronner et al. ............. 438/275 |
| 6,768,179 | B2 |   | 7/2004 | Cho et al. |
| 6,991,972 | B2 | * | 1/2006 | Lochtefeld et al. .......... 438/149 |
| 2003/0080387 | A1 | * | 5/2003 | Cho et al. .................... 257/369 |
| 2003/0176049 | A1 | * | 9/2003 | Hegde et al. ................ 438/591 |
| 2004/0256700 | A1 |   | 12/2004 | Doris et al. |
| 2005/0064690 | A1 |   | 3/2005 | Amos et al. |
| 2005/0082605 | A1 | * | 4/2005 | Akasaka ..................... 257/329 |
| 2005/0093104 | A1 |   | 5/2005 | Ieong et al. |
| 2005/0116290 | A1 |   | 6/2005 | de Souza et al. |

OTHER PUBLICATIONS

Chinese Patent Application Publication No. CN1225507A, published on Aug. 11, 1999, English-langugue abstract only.

* cited by examiner

*Primary Examiner*—Thomas L Dickey
(74) *Attorney, Agent, or Firm*—Scully, Scott, Murphy & Presser, P.C.; Louis J. Percello, Esq.

(57) ABSTRACT

A method of fabricating semiconductor structure is provided in which at least one nFET device and a least one pFET device are formed on a semiconductor substrate. Each device region formed includes a dielectric stack that has a net dielectric constant equal to or greater than silicon dioxide. Gate stacks are provided on each of the dielectric stacks, wherein one of the gate stacks includes a metal gate electrode located atop a surface of a thinned polygate electrode.

18 Claims, 13 Drawing Sheets

METHOD OF FABRICATING A SEMICONDUCTOR STRUCTURE INCLUDING ONE DEVICE REGION HAVING A METAL GATE ELECTRODE LOCATED ATOP A THINNED POLYGATE ELECTRODE

FIELD OF THE INVENTION

The present invention relates to a semiconductor structure, and more particularly to a complementary metal oxide semiconductor (CMOS) structure including at least one nFET device and at least one pFET device located on a surface of a semiconductor substrate. In accordance with the present invention, a semiconductor structure is provided wherein at least one of the nFET or pFET devices includes a gate electrode stack comprising a thinned Si-containing electrode, i.e., polysilicon electrode, and an overlying first metal, while the other device includes a gate electrode stack that includes at least the first metal gate, without the thinned Si-containing electrode. A method of fabricating such a semiconductor structure is also provided for in the present invention.

BACKGROUND OF THE INVENTION

In current complementary metal oxide semiconductor (CMOS) technology, a polysilicon gate is typically employed. One disadvantage of utilizing polysilicon gates is that at inversion the polysilicon gates generally experience depletion of carriers in the area of the polysilicon gate that is adjacent to the gate dielectric. This depletion of carriers is referred to in the art as the polysilicon depletion effect. The depletion effect reduces the effective gate capacitance of the CMOS device. Ideally, it is desirable that the gate capacitance of the CMOS device be high since high gate capacitance typically equates to more charge being accumulated in the inversion layer. As more charge is accumulated in the channel, the source/drain current becomes higher when the transistor is biased.

CMOS devices including a gate electrode stack comprising a bottom polysilicon portion and a top silicide portion are also known. The layer of silicide in such a gate electrode stack contributes to a decrease in the resistance of the gate. The decrease in resistance causes a decrease in the time propagation delay RC of the gate. Although a silicide top gate region may help decrease the resistance of the transistor, charge is still depleted in the vicinity of the interface formed between the bottom polysilicon gate and gate dielectric, thereby causing a smaller effective gate capacitance.

Another type of CMOS device that is available is one where the gate electrode includes at least a metal layer beneath a Si-containing, e.g., polysilicon, gate electrode. In such CMOS devices, the metal of the gate prevents depletion of charge through the gate. This prevents the decrease in effective thickness of the gate capacitance. Although metal-gated devices address the depletion problem mentioned above in regard to polysilicon gates, it is difficult to obtain nFET and pFET workfunctions using metal gated devices due to instability in threshold voltage. This is especially the case when high k dielectrics such as Hf-based dielectrics are used as the gate dielectric of metal gated devices.

In such technologies, high k metal dielectric stacks are needed to enable CMOS scaling to continue. The new generation of dielectric stacks offers the potential to achieve electrically thinner dielectrics with low gate leakage. In order to design metal gated high k devices using conventional methodologies, the gate electrode stacks should have the same workfunction as the polysilicon gated devices. Thus, two gate electrode stacks are needed, one for the nFET device and another for the pFET device.

Although a considerable amount of effort and progress has been made to find p-type and n-type gate electrode stacks, it is unlikely that suitable options will be found for both simultaneously. It is more likely that one acceptable gate electrode stack (either n or p) would be found first.

Circuit performance would improve significantly even if one of the devices included a gate stack with a high k dielectric and a band edge workfunction. Therefore, the need exists for a semiconductor structure where one device includes a gate electrode stack that includes a Si-containing electrode and an overlying first metal and the other device includes a gate electrode stack that includes the first metal without, the underlying Si-containing electrode.

SUMMARY OF THE INVENTION

In view of the prior art discussed hereinabove, the present invention provides a semiconductor structure and a method of fabricating the same wherein the structure includes at least one nFET device and a least one pFET device, where at least one of the devices is a Si-containing gated device and the other device is a metal gated device. That is, the present invention provides a semiconductor structure wherein at least one of the nFET or pFET devices includes a gate electrode stack comprising a thinned Si-containing electrode, i.e., polysilicon electrode, and an overlying first metal, while the other device includes a gate electrode stack that includes at least the first metal gate, without the thinned Si-containing electrode. The method of the present invention is different from prior art approaches in that the inventive processing steps feature techniques to fabricate both a thin Si containing gate electrode device and a metal gated device in the same circuit.

In general terms, the present invention provides a semiconductor structure that comprises:

a semiconductor substrate including at least one nFET device region and at least one pFET device region;

a first dielectric stack having a net dielectric constant equal to or greater than silicon dioxide located on a surface of said substrate and within said at least one nFET device region;

a second dielectric stack having a net dielectric constant equal to or greater than silicon dioxide located on a surface of said substrate and within said at least one pFET device region; and a first gate electrode stack comprising a first metal layer located on either said first dielectric stack or said second dielectric stack and a second gate electrode stack comprising at least a Si-containing electrode having a thickness of less than 60 nm and an overlying first metal, said second gate electrode stack is located on the first dielectric stack or the second dielectric stack which does not include said first gate electrode stack.

In addition to the semiconductor structure provided above, the present invention also provides a method of fabricating such a structure. In general terms, the method of the present invention comprises:

providing a structure comprising a semiconductor substrate including at least one nFET device region and at least one pFET device region, said at least one nFET device region includes a first dielectric stack having a net dielectric constant equal to or greater than silicon dioxide located on a surface of said substrate and said at least one pFET device region has a second dielectric stack having a net dielectric constant equal to or greater than silicon dioxide located on a surface of said substrate; and forming a first gate electrode stack comprising a first metal layer located on either said first dielectric stack or said second dielectric stack and a second gate electrode stack comprising at least a Si-containing electrode having a thickness of about 60 nm or less and an overlying first metal, said second gate electrode stack is located on the first dielectric stack or the second dielectric stack which does not include said first gate electrode stack.

DETAIL DESCRIPTION OF THE DRAWINGS

Figure 1A:
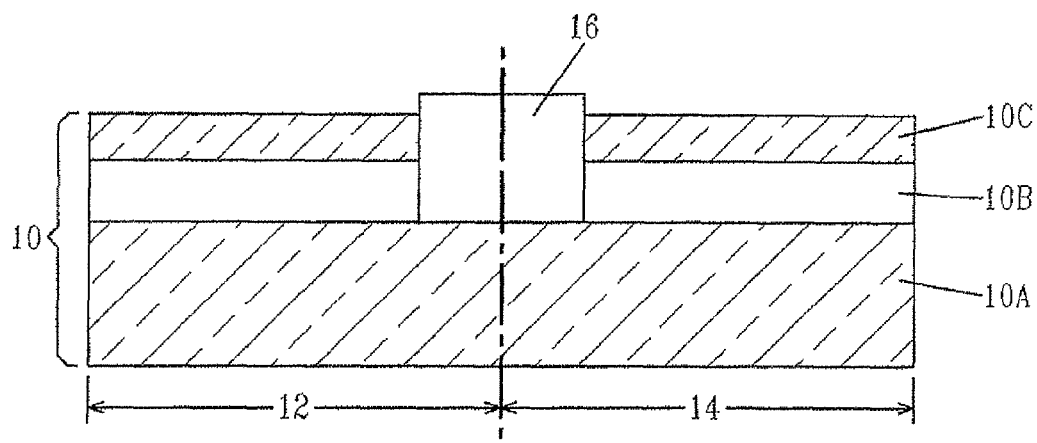
FIGS. 1A-1L are pictorial representations (through cross sectional views) depicting one embodiment of the present invention.

The present invention, which provides a semiconductor structure including at least one nFET device and at least one pFET device, wherein at least one of the nFET or pFET devices includes a gate electrode stack comprising a thinned Si-containing electrode, i.e., polysilicon electrode, and an overlying first metal, while the other device includes a gate electrode stack that includes at least the first metal gate, without the thinned Si-containing electrode, as well as a method of fabricating the same, will now be described in greater detail by referring to the following discussion and drawings that accompany the present application. It is noted that the drawings of the present application are provided for illustrative purposes and, as such, they are not drawn to scale. Moreover, and in the various drawings of the present application, like and corresponding elements and referred to by like reference numerals.

The method of the present invention will now be described in greater detail by referring to FIGS. 1A-1L. It is noted that these drawings show a fragment of a semiconductor substrate including a single nFET device region and a single pFET device region. Although such an embodiment is specifically shown and described, the present invention is not limited to a single region for the pFET devices and the nFET devices, but instead contemplates a plurality of each of such device regions located throughout the remaining portions of the substrate. Also, more than one nFET device and pFET device can be formed in the corresponding device region.

Reference is first made to FIG. 1A which shows an initial structure that is employed in the present invention. The initial structure includes a semiconductor substrate 10 comprising at least one nFET device region 12 (i.e., an area of the substrate 10 in which nFETs will be subsequently formed) and at least one pFET device region 14 (i.e., an area of the substrate 10 in which pFETs will be subsequently formed). In accordance with the present invention, the at least one nFET device region 12 and the at least one pFET device region 14 are separated (in the lateral direction) by an isolation region 16.

The semiconductor substrate 10 of the initial structure shown in FIG. 1A comprises any semiconducting material including, but not limited to: Si, Ge, SiGe, SiC, SiGeC, GaAs, GaN, INAs, InP and all other III/V or II/VI compound semiconductors. Semiconductor substrate 10 may also comprise an organic semiconductor or a layered semiconductor such as Si/SiGe, or a semiconductor-on-insulator (SOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques such as described, for example, in U.S. Ser. No. 10/250,241, filed Jun. 17, 2003, now U.S. Publication No. 20040256700A1, U.S. Ser. No. 10/725,850, filed Dec. 2, 2003, and U.S. Ser. No. 10/696,634, filed Oct. 29, 2003, the entire contents of each are incorporated herein by reference.

It is noted that in the drawings of the present invention an SOI substrate including a bottom semiconductor layer 10A and a top semiconductor layer 10C that are separated by a buried insulating layer 10B is depicted for illustrative proposes and that this depiction in no way suggests that the invention is limited to such an embodiment. Instead, bulk semiconductors as mentioned above are also contemplated as well as other layered semiconductors. In the illustration, the top and bottom semiconductor layers, 10C and 10A, respectively, comprise one of the aforementioned semiconductor materials, while the buried insulating layer 10B is comprised of a crystalline or non-crystalline oxide, nitride or oxynitride. The SOI substrates can be formed utilizing standard processes well known in the art including, for example, a layer transfer process or SIMOX (separation by ion implantation of oxygen).

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells" and they are formed utilizing conventional ion implantation processes.

At least one isolation region 16 is then typically formed into the semiconductor substrate 10. The isolation region 16 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The depth of the trench used in forming the trench isolation region may vary and is not critical to the present invention. For example, the depth of the trench can extend to the surface of the buried insulating layer 10B when an SOI substrate is used, it can also extend entirely through the buried insulating layer 10B when an SOI substrate is used, or it can extend only through a portion of the top semiconductor layer 10C when an SOI substrate is used. The field oxide may be formed utilizing a so-called local oxidation of silicon process. Note that the at least one isolation region 16 provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type). The later case is shown in the drawings of the present application.

Figure 1B:
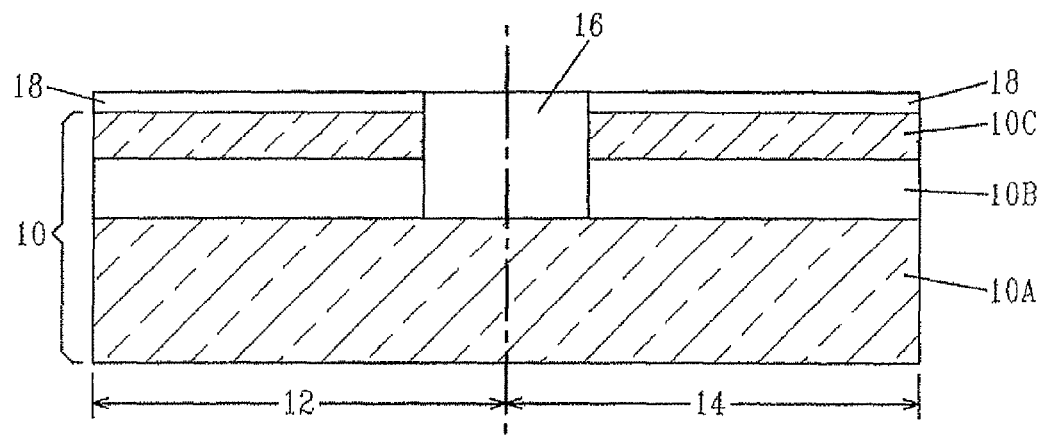

FIG. 1B illustrates the structure of FIG. 1A after forming a sacrificial layer 18, such as an oxide or oxynitride, on the exposed surface of at least the semiconductor substrate 10. In some embodiments, not shown, the sacrificial layer 18 can extend atop the isolation region 16 as well. In accordance with the present invention, the sacrificial layer 18 is a thick layer having a thickness on the order of about 3 to about 10 nm. A thick sacrificial layer 18 is employed in the present invention to protect the device channel region during the dielectric removal processing. The sacrificial layer 18 is formed utilizing a conventional deposition process such as, for example, chemical vapor deposition (CVD), plasma enhanced chemical vapor deposition (PECVD), evaporation, chemical solution deposition and other like deposition processes. Alternatively, the sacrificial layer 18 is formed utilizing a thermal oxidation or oxynitridation process.

Figure 1C:
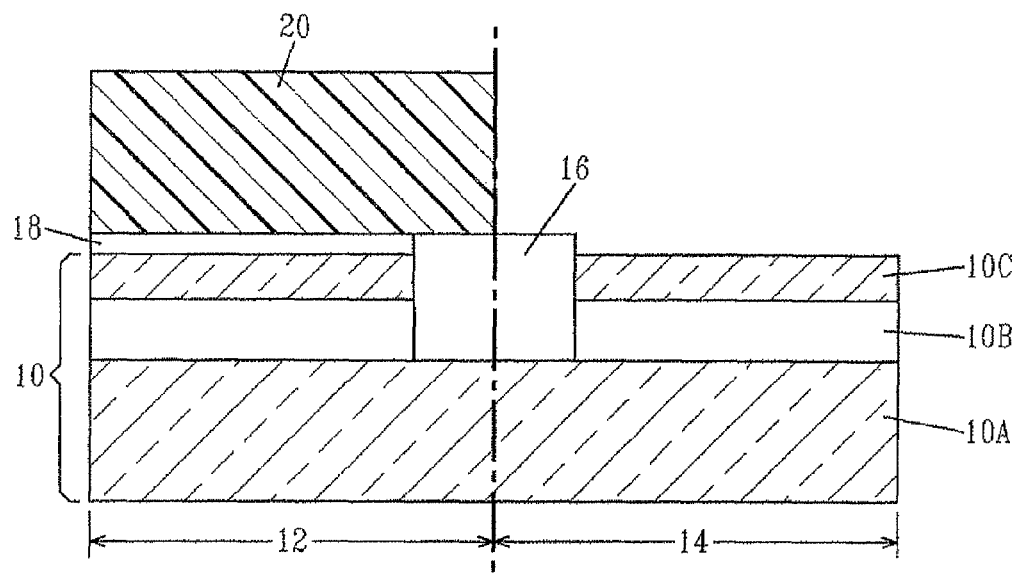

FIG. 1C illustrates the structure of FIG. 1B after forming a patterned block mask 20 on the nFET device region 12 and removing the exposed sacrificial layer 18 from the pFET device region 14. As shown, the patterned block mask 20 protects the nFET device region 12, while leaving the pFET device region 14 unprotected. It should be emphasized that the structure shown in FIG. 1C represents one embodiment of the present invention. In another embodiment not shown in the drawings, the patterned mask 20 is formed so as to protect the pFET device region 14; in the embodiment not shown, the formation of the pFET dielectric and the nFET dielectric stacks are reversed from what is described herein below. The embodiment illustrated herein represents a preferred embodiment of the present.

The patterned block mask 20 is formed utilizing conventional techniques well known in the art. For example, a blanket layer of block mask material, typically an organic photoresist, is deposited over the entire structure shown in FIG. 1B. The block mask material is then patterned by lithography which includes the steps of exposing the block mask material to a pattern of radiation and developing the exposed layer.

After forming the patterned block mask 20, the exposed sacrificial layer 18 is removed utilizing a wet chemical etching process so as to expose the surface of the semiconductor substrate 10. The wet chemical etching process includes the use of a chemical etchant that is selective in removing the sacrificial layer 18. The choice of the exact chemical etchant may vary depending on the type of sacrificial material to be removed and its selection can be determined by one skilled in the art. The resultant structure that is formed is shown, for example, in FIG. 1C.

After a suitable resist removal and pre-gate dielectric cleaning processes are performed, a pFET dielectric 22 is formed on at least the exposed surface of the substrate 10; some of the pFET dielectric 22 can be formed atop the sacrificial layer 18 in the nFET device region 12, since the first patterned block mask 20 is typically removed prior to forming the pFET dielectric 22. The resultant structure is shown, for example, in FIG. 1D. In accordance with the present invention, the pFET dielectric 22 has a net dielectric constant that is equal to or greater than silicon dioxide. Illustrative examples of such dielectrics that can be used as the pFET dielectric 22 include, but are not limited to: SiON, $SiO_2$ $Al_2O_3$, AlON, AlN, or any other dielectrics including Hf— and Zr-based dielectrics and combinations and multilayers thereof. The pFET dielectric 22 may comprise, in some embodiments, an oxynitride, an oxidized silicon nitride or a plasma nitrided oxide.

The pFET dielectric 22 is formed by a thermal process such as wet or dry oxidation. Alternatively, the pFET dielectric 22 may be formed by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes including combinations thereof The physical thickness of the pFET dielectric 22 may vary, but typically, the pFET dielectric 22 has a thickness from about 0.5 to about 10 nm, with a thickness from about 0.5 to about 3 nm being more typical.

Figure 1D:
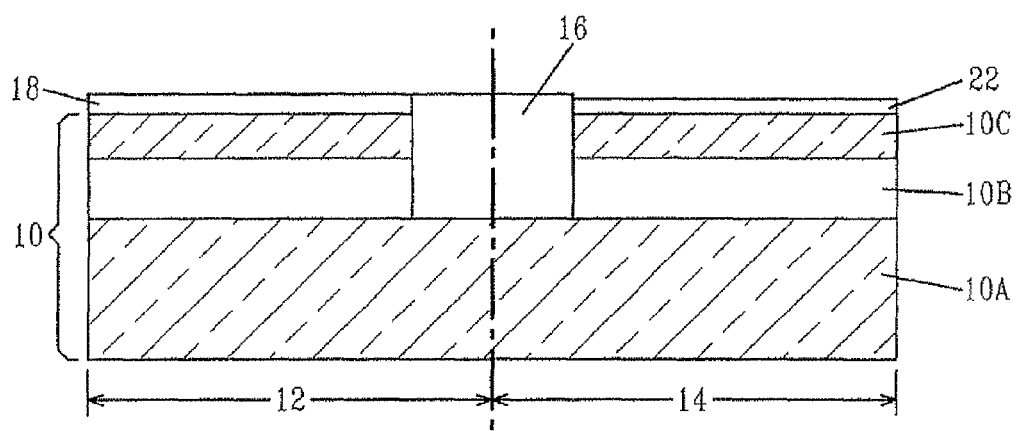
Figure 1E:
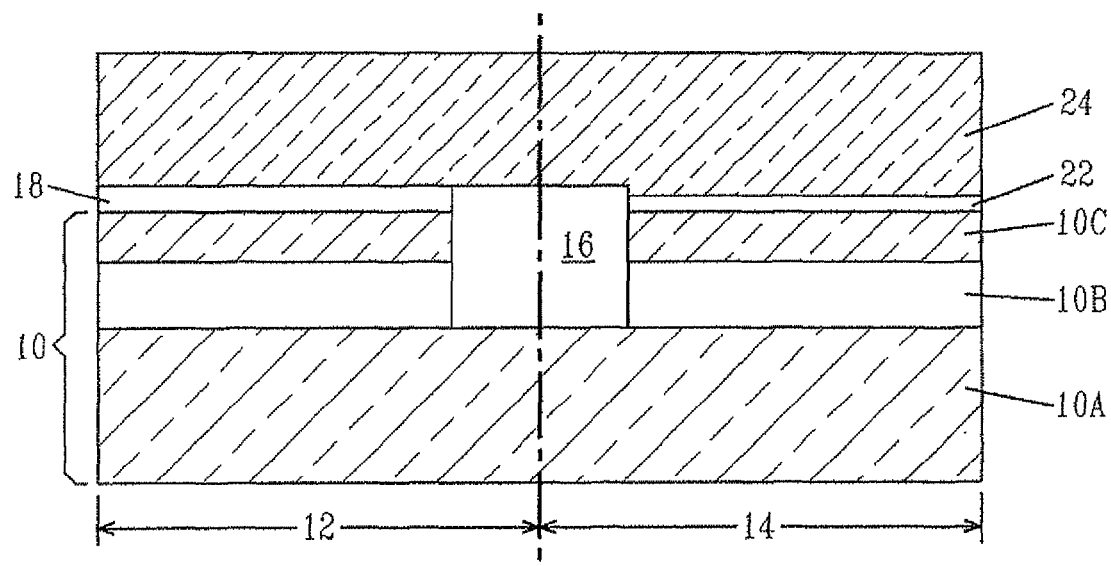

FIG. 1E shows the structure of FIG. 1D after forming a Si-containing gate electrode 24 atop both the sacrificial layer 18 (in the nFET device region 12) and the pFET dielectric 22 (in the pFET device region 14). The Si-containing electrode 24 comprises Si or a SiGe alloy layer in either single crystal, polycrystalline or amorphous form. Preferably, the Si-containing electrode 24 is comprised of polysilicon.

The Si-containing electrode 24 is formed utilizing a conventional deposition process well known in the art. For example, CVD, PECVD, evaporation, and chemical solution deposition are some examples of deposition techniques that can be used in forming the Si-containing electrode 24. In accordance with this embodiment of the present invention, the height of the as deposited Si-containing electrode 24 is typically from about 10 to about 100 nm, with a height from about 15 to about 75 nm being even more typical. This height represents the vertical thickness of the as deposited material.

Figure 1F:
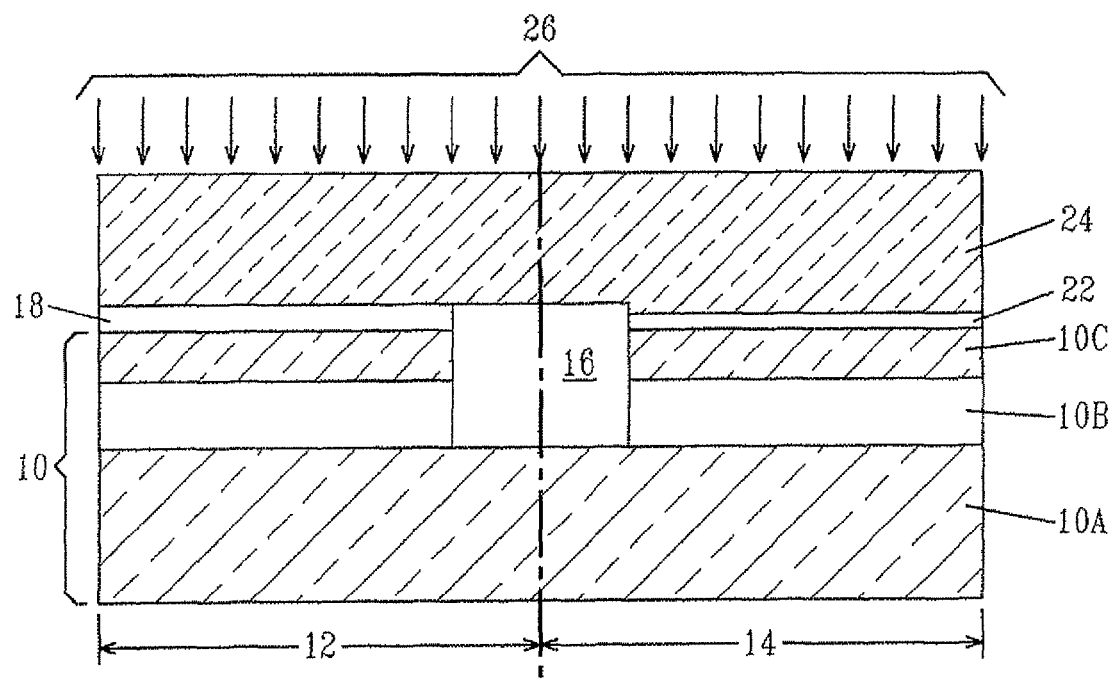

FIG. 1F shows the structure during an ion implantation step wherein either a p-type dopant or an n-type dopant is implanted. In this drawing figure, reference numeral 26 denotes the dopant ions being implanted into the previously as deposited Si-containing electrode 24. The type of dopant being implanted at this step of the present invention depends on which device region will include the Si-containing electrode. When the Si-containing electrode 24 is to be present in the pFET device region 14, a p-type dopant including one selected from a Group IIIA element of the Periodic Table of Elements is employed. Examples of p-type dopants include, for example, B, Al, Ga, and/or In. When the Si-containing electrode 24 is to be present in the nFET device region 12, an n-type dopant including one selected from a Group VA element of the Periodic Table of Elements is employed. Illustrative examples of n-type dopants include, for example, P, As and/or Sb. In the specific embodiment illustrated, the Si-containing electrode 24 will remain in the pFET device region 14 hence an element from Group IIIA of the Periodic Table of Elements is used as the dopant.

The conditions for the ion implantation, including dopant concentration, implant energy, implant temperature and the like, are well known to those skilled in the art. Following the ion implantation step, a conventional activation anneal process including, for example, a rapid thermal anneal (RTA) or a furnace anneal, is used to activate the implanted dopants. The exact temperature and time for the activation anneal may vary and such conditions are well known to those skilled in the art. A typical annealing temperature is about 800° C. or greater.

In some embodiments, the ion implantation step shown in FIG. 1F can be avoided if an in-situ deposition process is used in forming the Si-containing electrode 24.

At this point of the present invention, the Si-containing electrode 24 is thinned from its as deposited thickness to a thickness that is about ½ or less. In the drawings that following, reference numeral 24' is used to designate the thinned Si-containing electrode. The thinned Si-containing electrode 24' typically has a thickness from about 5 to about 50 nm, with a thickness from about 8 to about 25 nm being even more typical for the thinned Si-containing electrode 24'.

Thinning of the Si-containing electrode can be achieved using one of the following methods: (I). In one method, thinning is achieved by chemical mechanical polishing or by utilizing another planarization process such as grinding. (II). A timed reactive ion etching reactive-ion etching (RIE) process or a RIE process utilizing a predictive end point detection method can be used to thin the Si-containing electrode. (III). A dopant profile can be formed in the Si-containing electrode material 24, and then a selective etching process can be used to remove the doped region selective to the dopant region. For example, As, Sb, or P implantation can be used, while blocking the nFET device region 12 with a block mask and then a selective chemical etching process is used. Alternatively the implantation and thinning process may be performed on the blanket Si-containing electrode material, without the block mask. One example of a selective etch that can be employed in the present invention is one wherein chlorine is used.

Figure 1G:
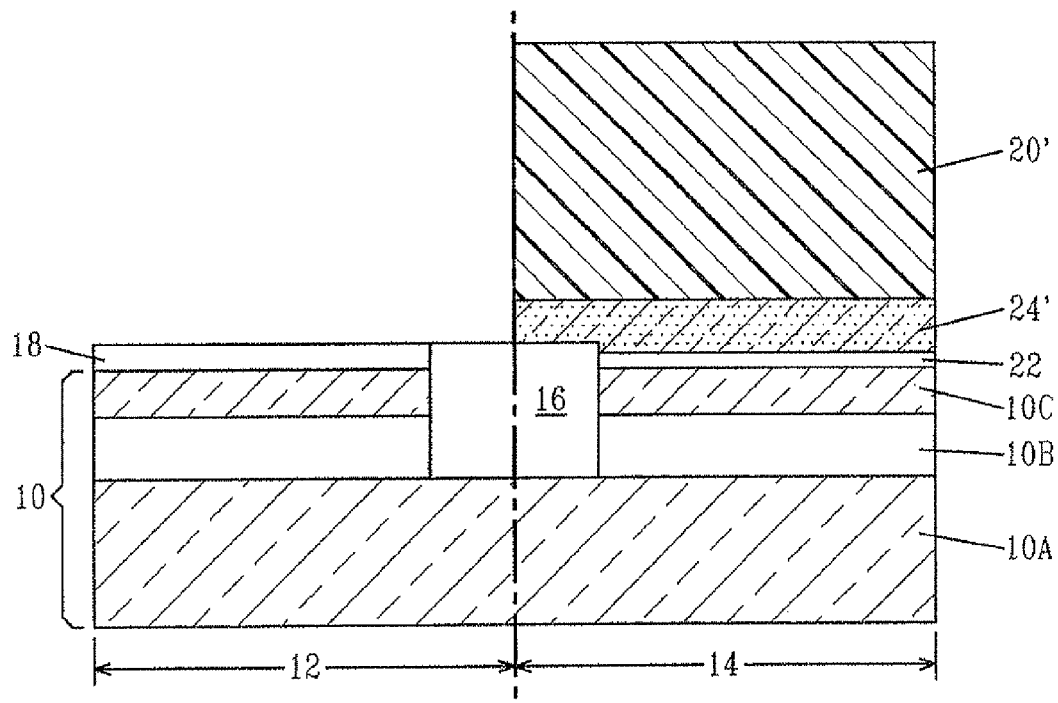
Figure 1H:
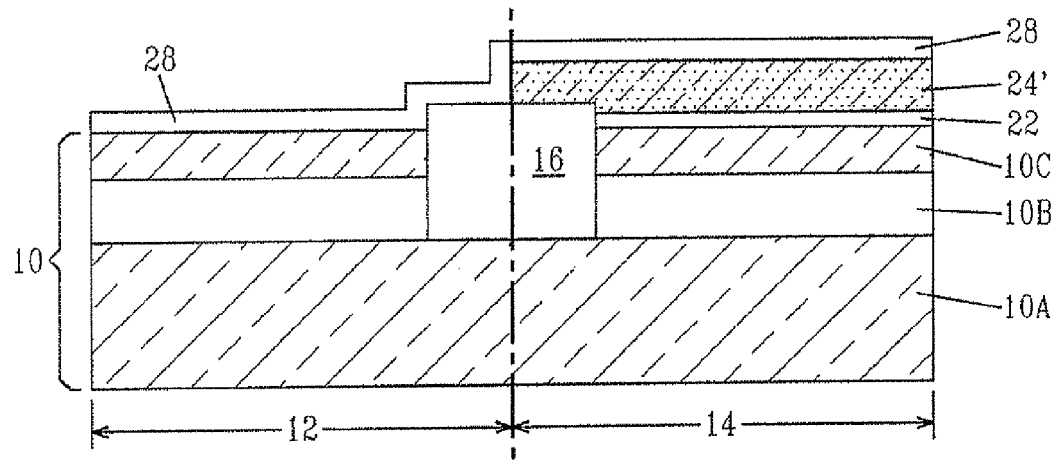

FIG. 1G illustrates the structure formed after one of the above mentioned thinning processes is employed. FIG. 1G also shows the structure after forming a patterned block mask 20' which protects the material layers of one of the device regions during removal of the thinned Si-containing electrode 24' from one of the device regions, e.g., the nFET device region 12. In the embodiment illustrated, the patterned block mask 20' is formed so as to protect the pFET device region 14, while leaving the material layers within the nFET device region 12 exposed. The patterned block mask 20' is formed as described above.

An etching process such as reactive ion etching is then used to remove the thinned Si-containing electrode 24' from the device region not including the second patterned block mask 20'. In the specific embodiment illustrated, this etching step removes the thinned Si-containing electrode 24' from the nFET device region 12. Note that after etching, the sacrificial layer 18 is exposed.

With the patterned block mask 20' in place, the exposed sacrificial layer 18 is removed from the structure utilizing a conventional etching process that is selective in removing the sacrificial material from the structure. The type of etchant may vary depending on the material of the sacrificial layer 18 and the choice of such an etchant is well within the knowledge of one skilled in the art. Next, the patterned block mask 20' is removed utilizing a conventional resist stripping process and then an nFET dielectric stack 28 is formed over the exposed surface of the substrate 10 in the nFET device region 12 and atop the thinned Si-containing electrode 24' in the pFET device region 14. The resultant structure including the nFET dielectric stack 28 is shown, for example, in FIG. 1H.

In a preferred embodiment an interfacial layer, not shown in the drawings is formed on the nFET region 12 of the substrate 10 prior to formation of the nFET dielectric stack. The interfacial layer is formed utilizing a conventional wet chemical process technique that is well known to those skilled in the art. Alternatively, the interfacial layer may be formed by thermal oxidation, oxynitridation or by vapor deposition. When the substrate 10 is a Si-containing semiconductor, the interfacial layer is comprised of chemical oxide grown by wet processing, or thermally grown or deposited silicon oxide, silicon oxynitride or a nitrided silicon oxide. When the substrate 10 is other than a Si-containing semiconductor, the interfacial layer may comprise a semiconducting oxide, a semiconducting oxynitride or a nitrided semiconducting oxide or any other interface dielectric such as, for example, one having a low interface trap density with the semiconducting material. When present, the interfacial layer may be considered as part of the nFET dielectric stack.

The thickness of the interfacial layer is typically from about 0.4 to about 1.2 nm, with a thickness from about 0.6 to about 1 nm being more typical. The thickness, however, may be different after processing at higher temperatures, which are usually required during CMOS fabrication.

In accordance with an embodiment of the present invention, the interfacial layer is a silicon oxide layer having a thickness from about 0.6 to about 1.0 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the interfacial layer can also be formed by treating the HF-last semiconductor surface in ozonated aqueous solutions, with the ozone concentration usually varying from, but not limited to: 2 parts per million (ppm) to 40 ppm.

In accordance with the preferred embodiment of the present invention illustrated herein, the nFET dielectric stack 28 includes an nFET dielectric and a layer of an alkaline earth metal-containing material or a rare earth metal (or a rare earth-like) containing material. The nFET dielectric, which is located beneath the layer of an alkaline earth metal-containing material or a rare earth metal (or a rare earth-like) containing material, is formed by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes, including combinations thereof. It is noted that in this step of the present invention, the nFET dielectric stack 28 is formed in both the device regions.

The nFET dielectric employed in the present invention is any dielectric material having a dielectric constant of equal to or greater than about 4.0, typically greater than about 7.0 that is typically used with an nFET device. Note that silicon dioxide has a dielectric constant of 4.0 and, as such, the present invention contemplates any dielectric whose dielectric constant is equal to or greater than that of silicon dioxide. In some embodiments, the nFET dielectric is the same as the pFET dielectric, while in other embodiments different dielectrics are employed in these two different types of devices. The nFET dielectric is typically a metal oxide or mixed metal oxide that is used with nFET devices. Illustrative examples of such dielectrics that can be used as nFET dielectric stack include, but are not limited: $SiO_2$, $SiON$, $TiO_2$, $La_2O_3$, $SrTiO_3$, $LaAlO_3$, $ZrO_2$, $Y_2O_3$, $Gd_2O_3$, $MgO$, $MgNO$, Hf-based dielectrics (to be described in greater detail herein below), and combinations including multilayers thereof. Preferably, the nFET dielectric is a Hf-based dielectric.

The term 'Hf-based dielectric' is intended herein to include any high k dielectric containing hafnium, Hf. Examples of such Hf-based dielectrics comprise hafiium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$ or rare earth oxide such as $La_2O_3$. MgO and MgNO can also be used. Typically, the Hf-based dielectric is hafnium oxide or hafnium silicate. Hf-based dielectrics typically have a dielectric constant that is greater than about 10.0.

The physical thickness of the nFET dielectric of stack 28 may vary, but typically, the nFET dielectric has a thickness from about 0.5 to about 10 nm, with a thickness from about 0.5 to about 3 nm being more typical.

In one embodiment of the present invention, the nFET dielectric is hafnium oxide that is formed by MOCVD were a flow rate of about 70 to about 90 mgrn of hafnium-tetrabutoxide (a Hf-precursor) and a flow rate of $O_2$ of about 250 to about 350 sccm are used. The deposition of Hf oxide occurs using a chamber pressure between 0.3 and 0.5 Torr and a substrate temperature of between 400° and 500° C. In another embodiment of the present invention, the nFET dielectric of stack 28 is hafnium silicate which is formed by MOCVD using the following conditions (i) a flow rate of the precursor Hf-tetrabutoxide of between 70 and 90 mg/m, a flow rate of $O_2$ between 25 and 100 sccm, and a flow rate of $SiH_4$ of between 20 and 60 sccm; (ii) a chamber pressure between 0.3 and 0.5 Torr, and (iii) a substrate temperature between 400° and 500° C.

The nFET dielectric stack 28 also includes a layer of an alkaline earth metal-containing material or a rare earth metal (or a rare earth-like) containing material. The alkaline earth metal-containing material comprises a compound having the formula $M_xA_y$, wherein M is an alkaline earth metal (Be, Mg, Ca, Sr, and/or Ba), A is one of O, S or a halide, and x is 1 or 2 and y is 1, 2 or 3. It is noted that the present invention contemplates alkaline earth metal-containing compounds that include a mixture of alkaline earth metals and/or a mixture of anions, such as $-OCl^{-2}$. Examples of alkaline earth metal-containing compounds that can be used in the present invention include, but are not limited to: MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in the present invention.

The alkaline earth metal-containing material is formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes. The alkaline earth metal-containing material typically has a deposited thickness from about 0.1 nm to about 3.0 nm, with a thickness from about 0.3 nm to about 1.6 nm being more typical.

When a rare earth metal-containing layer is used as on of the layers within nFET dielectric stack 28, the rare earth metal-containing layer comprises an oxide or nitride of at least one element from Group IIIB of the Periodic Table of Elements including, for example, La, Ce, Pr, Nd, Pm, Sm, Eu, Ga, Tb, Dy, Ho, Er, Tm, Yb, Lu or mixtures thereof. Preferably, the rare earth metal-containing layer comprises an oxide of La, Ce, Y, Sm, Er, and/or Th, with $La_2O_3$ or LaN being most preferred.

The rare earth metal-containing layer is formed utilizing a conventional deposition process including, for example, evaporation, molecular beam deposition, MOCVD, ALD, PVP and other like deposition processes. In one embodiment of the present invention, the rare earth metal-containing layer is formed by placing the structure into the load-lock of a molecular beam deposition chamber, followed by pumping this chamber down to the range of $10^{-5}$ to $10^{-8}$ Torr. After these steps, the structure is inserted, without breaking vacuum into the growth chamber where the rare earth metal-containing layer such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° to 1700° C., and a flow rate of 1 to 3 sccm of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1\times10^{-5}$ to $8\times10^{-5}$ Torr, and the La oxide growth rate can be in the range from 0.1 to 2 nm per minute, with a range from 0.5 to 1.5 nm being more typical.

The rare earth metal-containing layer typically has a thickness from about 0.1 nm to about 3.0 nm, with a thickness from about 0.3 nm to about 1.6 nm being more typical.

Figure 1I:
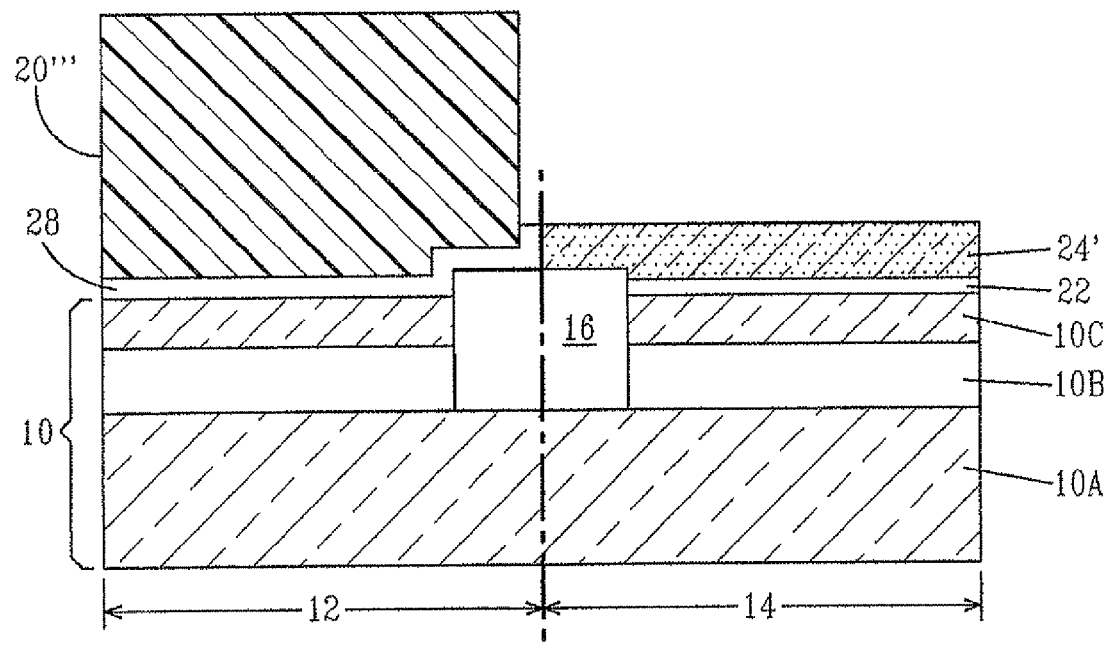

FIG. 1I shows the structure after forming a patterned block mask 20''' atop the nFET dielectric stack 28 in the nFET device region 12, while leaving the nFET dielectric stack 28 in the pFET device region 14 exposed. The patterned block mask 20''' is formed as described above. FIG. 1I also shows the structure after removing the exposed nFET dielectric stack 28 from the pFET device region 14. The exposed nFET dielectric stack 28 is removed utilizing an etching process that is selective in removing nFET dielectric and the alkaline earth metal-containing material or the rare earth metal (or a rare earth-like) containing material as compared to the patterned block mask 20''' and the thinned Si-containing electrode 24'. A chemical etchant, which can be selected by one skilled in the art, is typical used for removing the exposed portion of the nFET dielectric stack 28 from the pFET device region 14. After selectively removing the nFET dielectric stack 28 from the pFET device region 14, the patterned block mask 20''' is removed from the nFET device region 12 utilizing a conventional stripping process well known to those skilled in the art. It is noted that the presence of the alkaline earth metal-containing or rare earth metal-containing layer within the nFET region 12 results in a dielectric stack that includes no net negative charge.

Figure 1J:
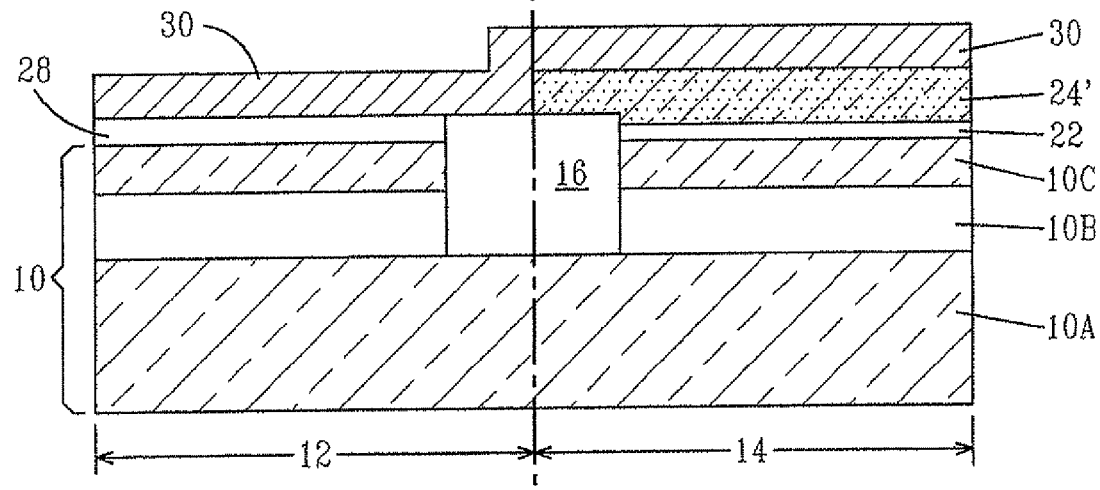

Next, and as shown in FIG. 1J, a first metal 30 is formed on all exposed surfaces of the structure shown in FIG. 1I utilizing a conventional deposition process. Examples of conventional depositions that can be used in forming the first metal 30 include, but are not limited to: CVD, PVD, ALD, sputtering or evaporation. The first metal 30 comprises a metallic material that is capable of conducting electrons. Specifically, the first metal layer 30 is a metal nitride or a metal silicon nitride. The first metal 30 comprises a metal from Group IVB or VB of the Periodic Table of Elements. Hence, the first metal 30 may include Ti, Zr, Hf, V, Nb or Ta, with Ti or Ta being highly preferred. By way of example, the first metal 30 preferably comprises TiN or TaN.

The physical thickness of the first metal 30 may vary, but typically, the first metal 30 has a thickness from about 0.5 to about 200 nm, with a thickness from about 5 to about 80 nm being more typical.

In one embodiment of the present invention, the first metal 30 is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 sccm. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

Figure 1K:
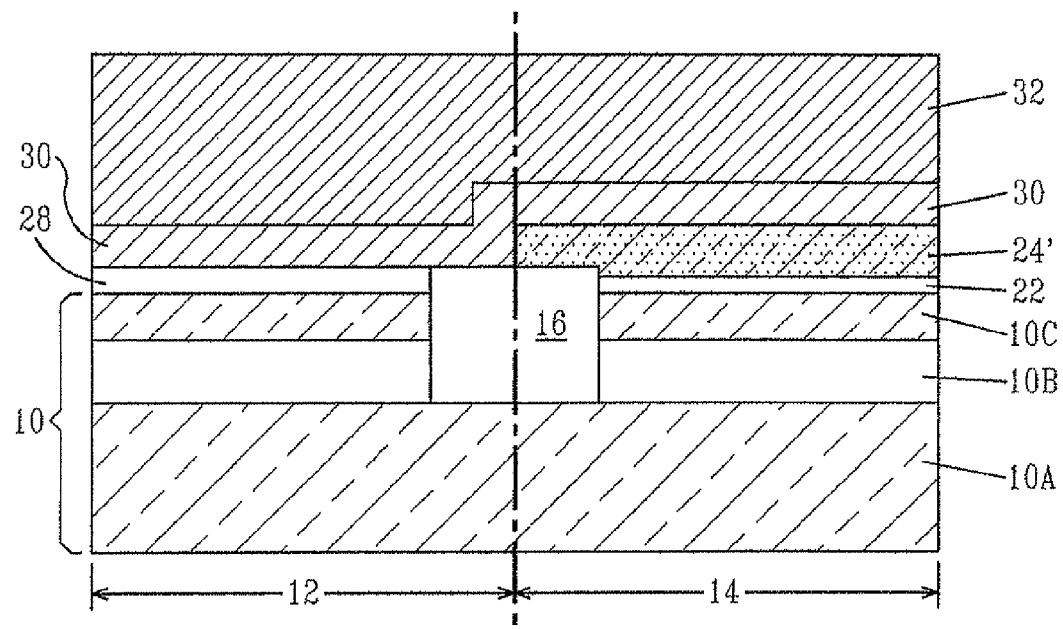
Figure 1L:
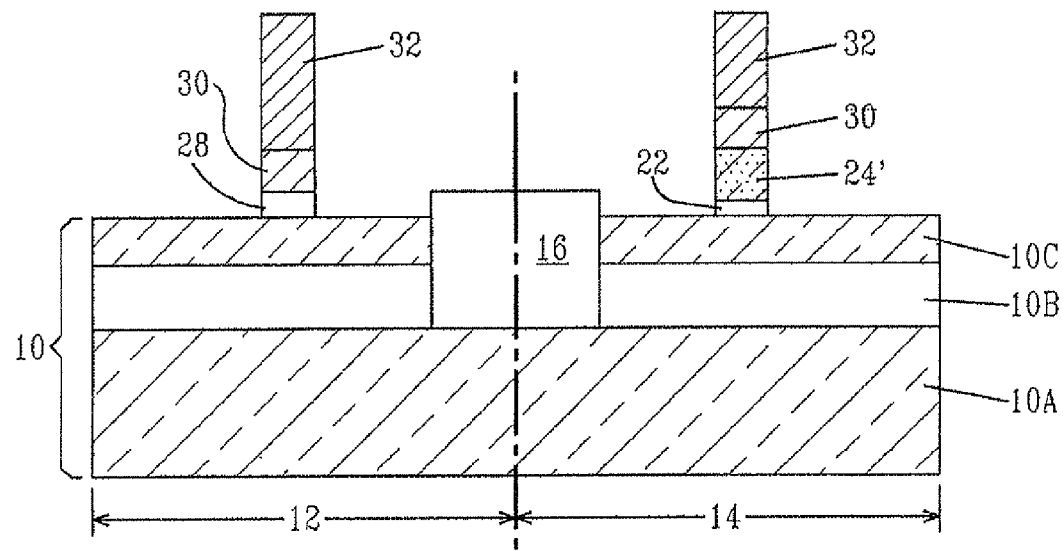

A gate electrode 32 such as shown in FIG. 1K is then formed atop the first metal 30. Specifically, a blanket layer of a conductive material is formed on the first metal 30 utilizing a known deposition process such as, for example, physical vapor deposition, CVD or evaporation. The conductive material used as the gate electrode 32 includes, but is not limited to: Si-containing materials such as Si or a SiGe alloy layer in either single crystal, polycrystalline or amorphous form. The gate electrode 32 may also be a conductive metal or a conductive metal alloy. Combinations of the aforementioned conductive materials are also contemplated herein. Si-containing materials are preferred as the gate electrode (or conductor) 32, with polySi being most preferred. In addition to aforementioned conductive materials, the present invention also contemplates instances wherein the conductor is fully silicided or a stack including a combination of a silicide and Si or SiGe. The silicide is made using a conventional silicidation process well known to those skilled in the art. Fully silicided gates can be formed using a conventional replacement gate process; the details of which are not critical to the practice of the present invention. The blanket layer of gate electrode 32 material may be doped or undoped. If doped, an in-situ doping deposition process may be employed in forming the same. Alternatively, a doped gate conductor can be formed by deposition, ion implantation and annealing. The ion implantation and annealing can occur prior to or after a subsequent etching step that patterns the material stack. The doping of the gate electrode 32 will shift the workfunction of the gate conductor formed. Illustrative examples of dopant ions for nFETs include elements from Group VA of the Periodic Table of Elements, while Group IIIA elements can be used when pFETs are formed. The thickness, i.e., height, of the gate electrode 32 deposited at this point of the present invention may vary depending on the deposition process employed. Typically, the gate electrode 32 has a vertical thickness from about 20 to about 180 nm, with a thickness from about 40 to about 150 nm being more typical.

Next, the gate stacks (including dielectric stacks and electrode stacks) are formed by lithography and etching of the material layers described above. The resultant structure that is formed after gate stack formation is shown, for example, in FIG. 1L.

Following patterning of the material stack, at least one spacer (not shown) is typically, but not always, formed on exposed sidewalls of each patterned material stack. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts (to be subsequently formed) do not encroach excessively underneath the edges of the patterned material stack. Typically, the source/drain silicide does not encroach underneath the edges of the patterned material stack when the at least one spacer has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain extensions and source/drain diffusion regions (also not shown) are formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, a forming gas anneal (5-10% hydrogen) can follow which is performed between 400° to 550° C. for interfacial layer/semiconductor substrate interface state passivation.

Further CMOS processing such as formation of silicided contacts (source/drain and gate) as well as formation of BEOL (back-end-of-the-line) interconnect levels with metal interconnects can be formed utilizing processing steps that are well known to those skilled in the art.

In yet another embodiment of the present invention, a metal/metal gate electrode stack can be formed within one of the device regions. The metal/metal gate electrode stack includes the first metal and a second metal. The second metal, which may comprise the same or different metal as the first metal 30, is formed above the first metal 30 utilizing one of the techniques described above for forming the first metal 30. In one embodiment, the first and second metals are comprised of TiN. The second metal is then selectively removed from one of the device regions by lithography and etching prior to forming the gate electrode 32. Specifically, after deposition of the nFET dielectric and the rare earth or alkaline metal containing layer, a first metal layer is deposited. Next a patterned block layer is formed over the nFET region and the metal, rare earth or alkaline metal containing layer, nFET dielectric and interfacial layer (if present) are removed using a dry or wet etch process capable of removing these materials selectively with respect to the pFET poly electrode. A second metal is then deposited over the entire wafer including the nFET, pFET and isolation regions. In this embodiment the final device structure includes two metal layers in the one gate stack and only one metal layer in at least another gate stack with the Si containing layer in proximity to the gate dielectric.

FIGS. 2A-2F shows an alternative embodiment of the present invention. The alternative embodiment begins by first providing the structure shown in FIG. 1A. After forming this structure, a pFET dielectric 22 (as described above) is formed on the exposed surfaces of the substrate 10 providing the structure shown, for example, in FIG. 2A. It is noted that the interfacial layer (as described above) may be present on the surface of the substrate 10 in both device regions prior to forming the pFET dielectric 22.

Figure 2A:
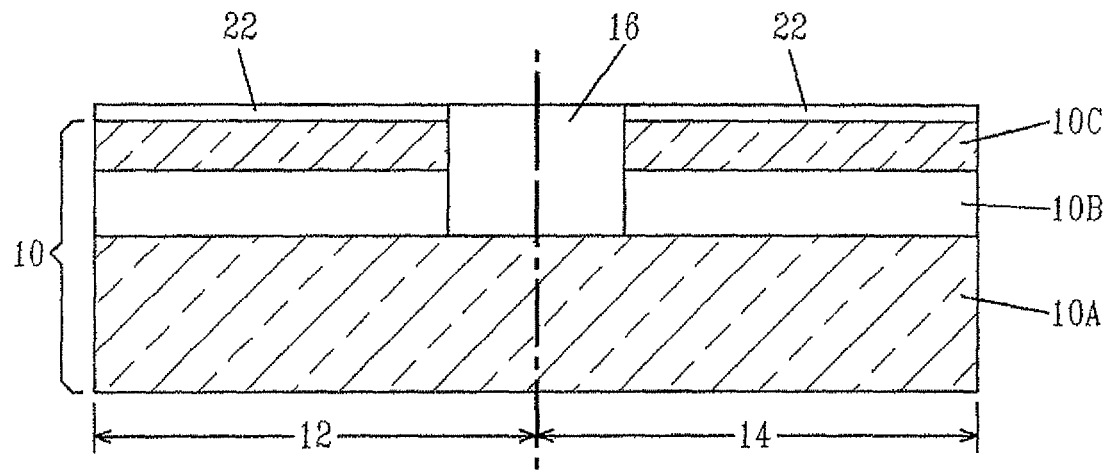
FIGS. 2A-2F are pictorial representations (through cross sectional views) depicting another embodiment of the present invention.
Figure 2B:
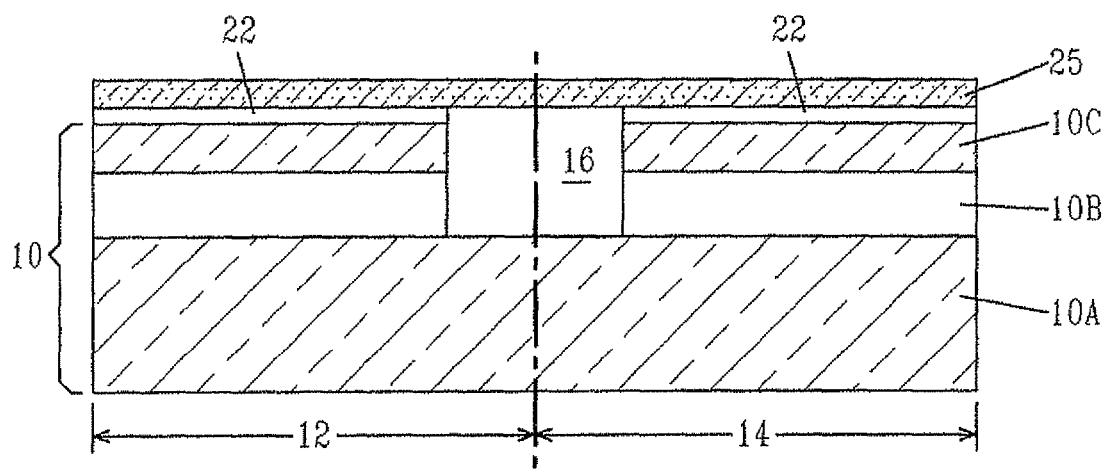
Figure 2C:
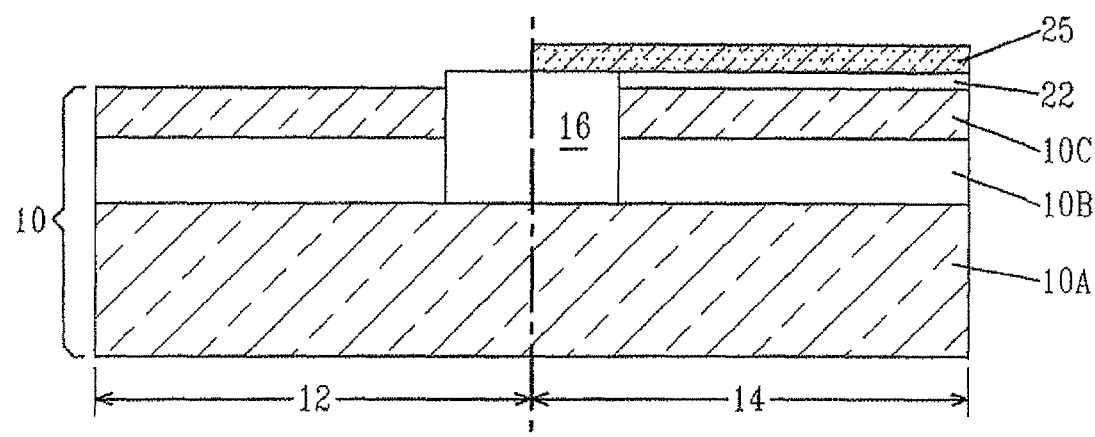

FIG. 2B shows the structure of FIG. 2A after forming a Si-containing electrode 25 on the nFET dielectric 22 in both of the device regions. The Si-containing electrode 25 is formed utilizing a conventional deposition process such as, for example, CVD, evaporation, PECVD, spin-on coating and the like. The Si-containing electrode 25 typically has a thickness from about 1 to about 60 nm at this point of the present invention, with a thickness from about 5 to about 25 nm being even more typical. It is noted that the Si-containing electrode 25 formed at this point of the alternative embodiment is essentially equivalent to the thinned Si-containing electrode 24' described above.

Next, a first patterned block mask (not shown) is formed protecting the pFET device region 14 and thereafter the exposed Si-containing electrode 25 and the underlying pFET dielectric 22 are removed from the nFET device region 12 utilizing one or more etching steps that are selective in removing these material layers from the nFET device region 12. A single etching step can be utilized or a combination of etching steps utilizing different chemical etchants can be used in removing layers 25 and 22 from the nFET device region 12. After exposing the substrate 10 (or alternatively the interfacial layer) in the nFET device region 12, the first patterned block mask is removed providing the structure shown in FIG. 2C.

Figure 2D:
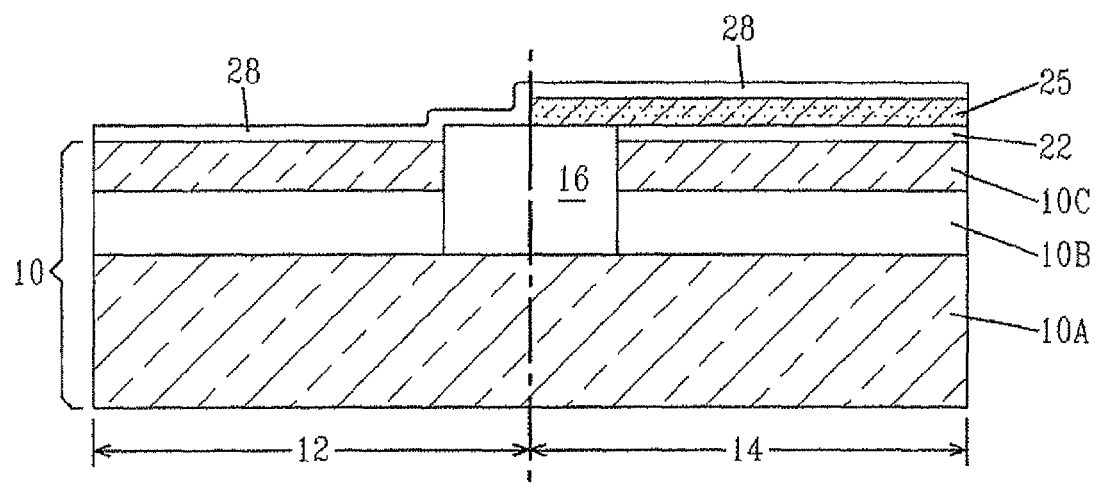
Figure 2E:
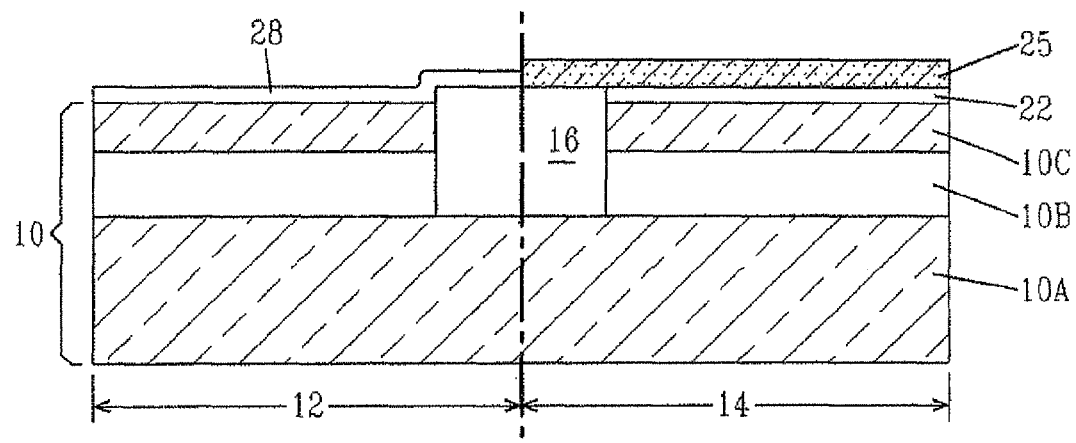

FIG. 2D shows the structure after forming the nFET dielectric stack 28 (as described above) in both of the device regions. A second patterned block mask (not shown) is then formed protecting the material layers within the nFET device region 12, and then the nFET dielectric stack 28 is selectively removed from the pFET device region 14 utilizing one or more etching steps that are selective in removing layer 28 from the pFET device region 14, stopping atop the Si-containing electrode 25. The second patterned block mask is then removed utilizing a conventional stripping process providing the structure shown, for example, in FIG. 2E.

Figure 2F:
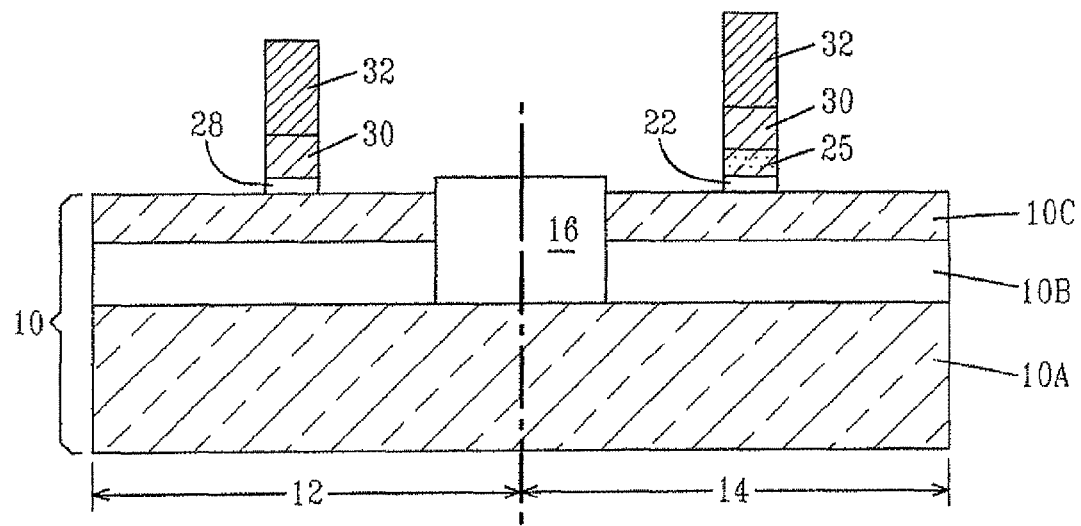

FIG. 2F shows the structure formed after forming the first metal 30, the gate electrode 32 and patterning each of the material stacks within the device regions forming patterned gate electrode stacks.

It is noted that the above processing steps can be modified to form the Si-containing electrode 25 in the nFET device region instead of the pFET device region.

In yet another embodiment of the present invention, a metal/metal gate electrode stack can be formed within one of the device regions. The metal/metal gate electrode stack includes the first metal and a second metal (as described above).

The structure shown in FIG. 2F can be processed as described above to form the other elements of an nFET device and a pFET device respectively, on the surface of the substrate 10.

FIGS. 3A-3G are pictorial representations (through cross sectional views) depicting a yet further embodiment of the present invention. Before describing this particular embodiment, it is emphasized that the threshold stability for pFET devices using a high k dielectric and a metal gate is problematic because of the oxygen vacancies created in the high k dielectric results in a dipole layer which, in turn, shifts the pFET effective workfunction toward midgap. This makes the short terms utilization of high k/metal gates for nFET devices unlikely. Integrating a high k/metal gate option for nFETs devices, while maintaining the typical best known method of SiON/polysilicon for the pFET device is an attractive method to enable the performance gains of embedded SiGe combined with SiON/polysilicon for pFET devices would cause a residual 'stringer' at the junction between the two devices because of the groundrule restrictions as sub 32 nm causing yield issues and severe integration challenges. This embodiment of the present application solves this particular problem.

Figure 3A:
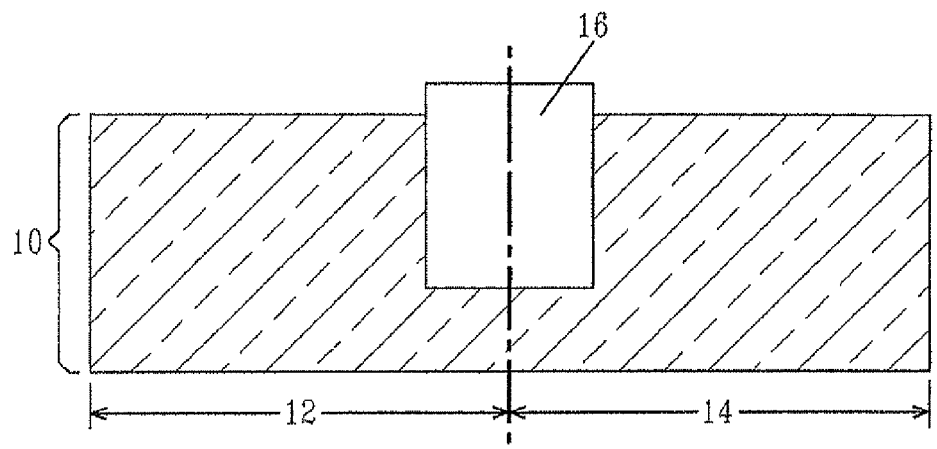
FIGS. 3A-3G are pictorial representations (through cross sectional views) depicting a yet further embodiment of the present invention.

FIG. 3A illustrates an initial semiconductor substrate 10 including at least one nFET device region 12 and at least one pFET device region 14 that are separated from each other by isolation region 16. The initial structure is essentially the same as employed in the first embodiment described above. Note that a bulk substrate 10 is shown for illustrative purposes only, and that this embodiment also works equally well with a semiconductor-on-insulator substrate.

Next, a thick sacrificial oxide 50, e.g., $SiO_2$, is formed on the substrate 10 in both device regions. The thick sacrificial oxide 50 is formed utilizing a conventional thermal technique (e.g., oxidation) or a conventional deposition process can be used. The thick sacrificial oxide 50 formed at this point of the present invention typically has a thickness from about 1 to about 20 nm, with a thickness from about 3 to about 10 nm being even more typical.

After forming the thick sacrificial oxide 50, a silicon nitride layer 52 is formed atop the thick sacrificial oxide 50 utilizing a conventional deposition process such as CVD or PECVD. The silicon nitride layer 52 serves as a polish stop layer in this embodiment of the present invention. The silicon nitride layer 52 typically has a thickness from about 5 to about 75 nm, with a thickness from about 20 to about 40 nm being even more typical.

Figure 3B:
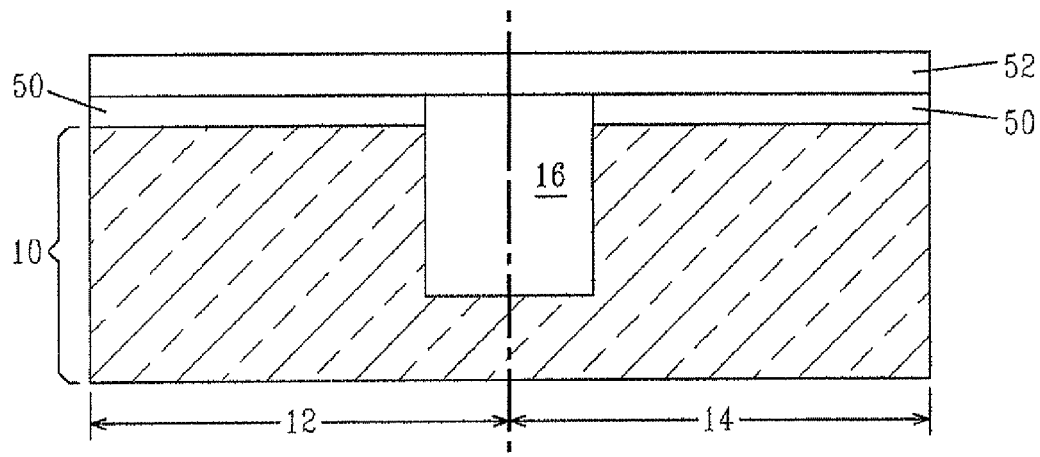
Figure 3C:
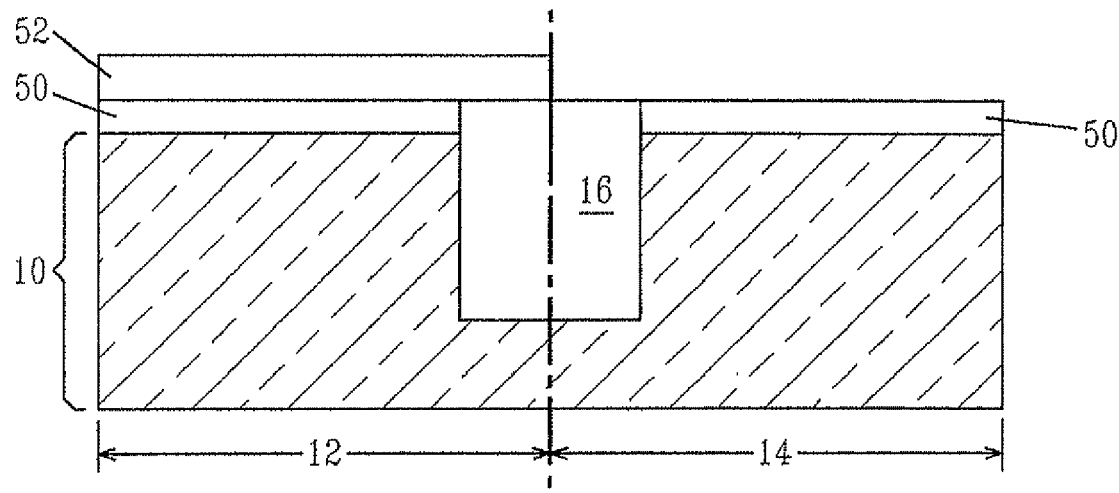

The resultant structure including the thick sacrificial oxide 50 and the layer of silicon nitride 52 is shown, for example, in FIG. 3B. FIG. 3C shows the structure that is formed after selectively removing the silicon nitride layer 52 from the pFET device region 14. The structure is formed by first providing a patterned block mask (not shown) atop the nFET device region 12. Deposition and lithography are used in forming the patterned block mask. An etching process that selectively removes silicon nitride is then used to remove the silicon nitride layer 52 from the pFET device region 14. After etching, the patterned block mask is removed from the structure providing the structure shown in FIG. 3C.

Figure 3D:
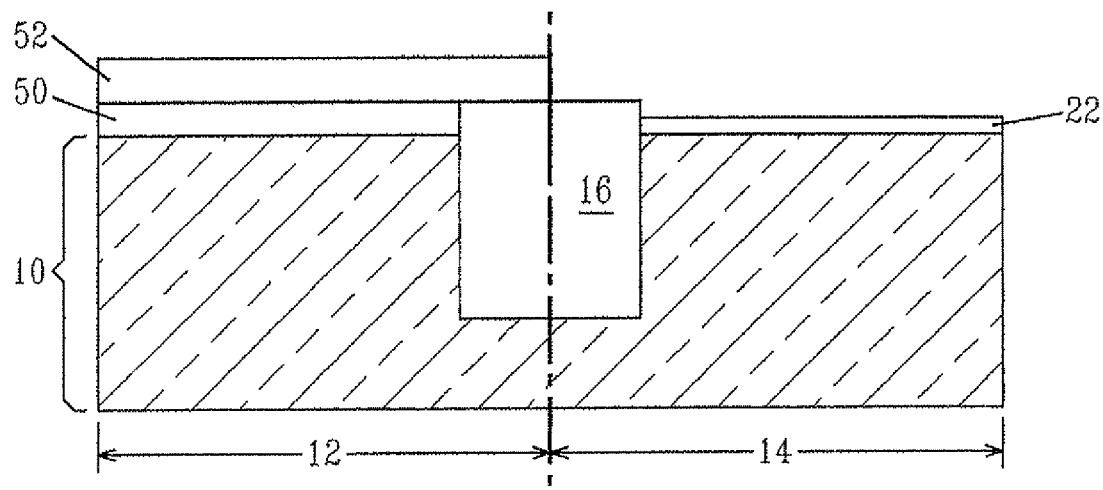

FIG. 3D shows the structure that is formed after the sacrificial oxide layer 50 is removed from the pFET device region 14 utilizing the silicon nitride layer 52 in the nFET device region 12 as a block mask and selectively forming a silcon oxynitride layer 54 in the pFET device region 14. An etching process that is selective in removing an oxide is used in removing the sacrificial oxide layer 50 from the pFET device region 14, and a conventional deposition process or a thermal technique is used in forming the silicon oxynitride layer 54. Note that the silicon oxynitride 54 serves as the pFET dielectric in this embodiment of the present invention. FIG. 3D also shows the structure after forming the pFET dielectric 22 (as described above) on the exposed substrate 10 in the pFET device region 12.

Figure 3E:
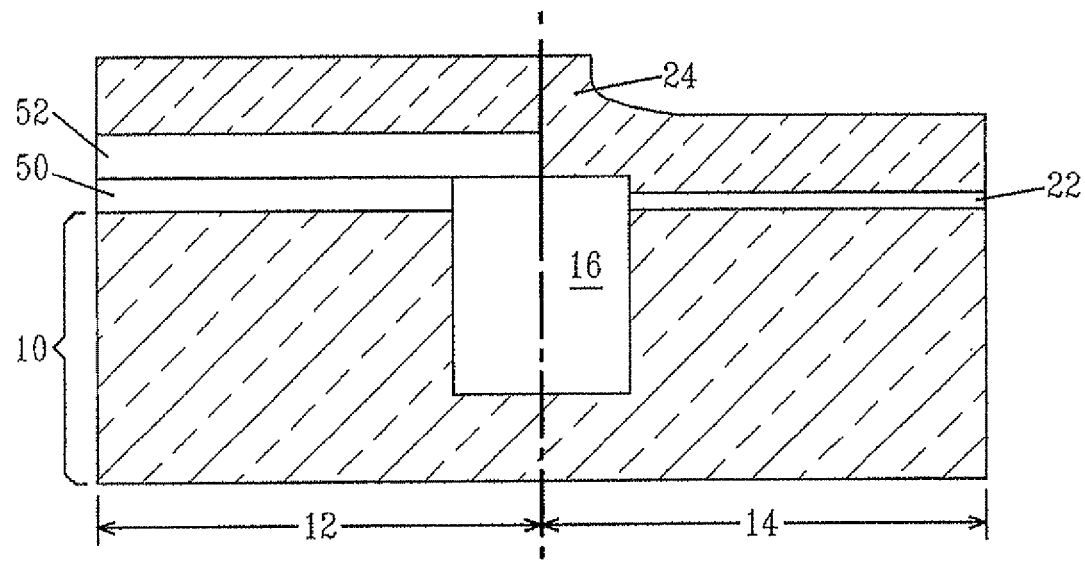
Figure 3F:
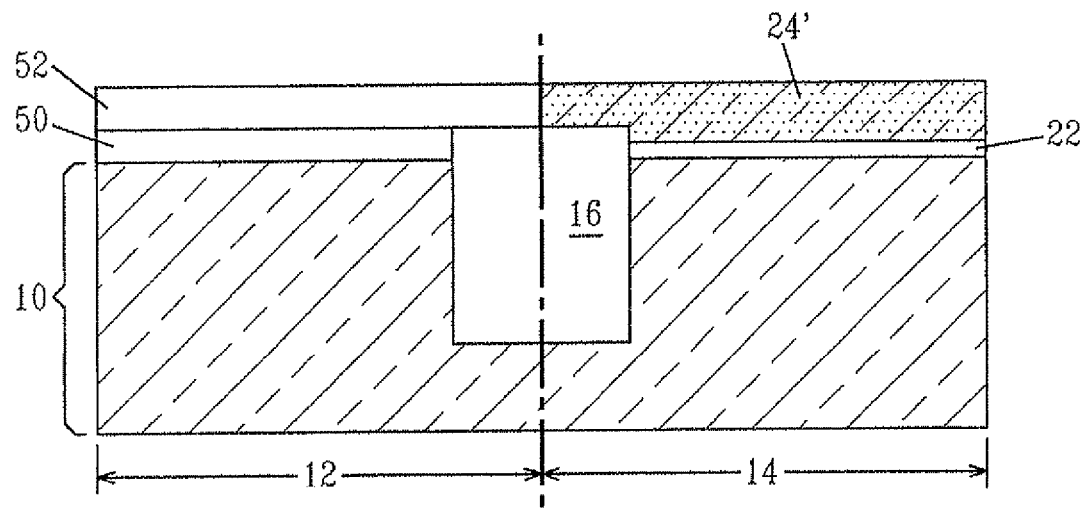

Next, and as shown in FIG. 3E, a Si-containing electrode 24 as described above is then formed on the structure in both device regions. A planarization process such as chemical mechanical polishing is used to provide the structure shown in FIG. 3F. The structure shown in FIG. 3F includes a thinned Si-containing electrode 24' in the pFET device region 14 that has a surface that is substantially co-planar with the surface of the silicon nitride layer 52 that is remaining in the nFET device region 12.

Figure 3G:
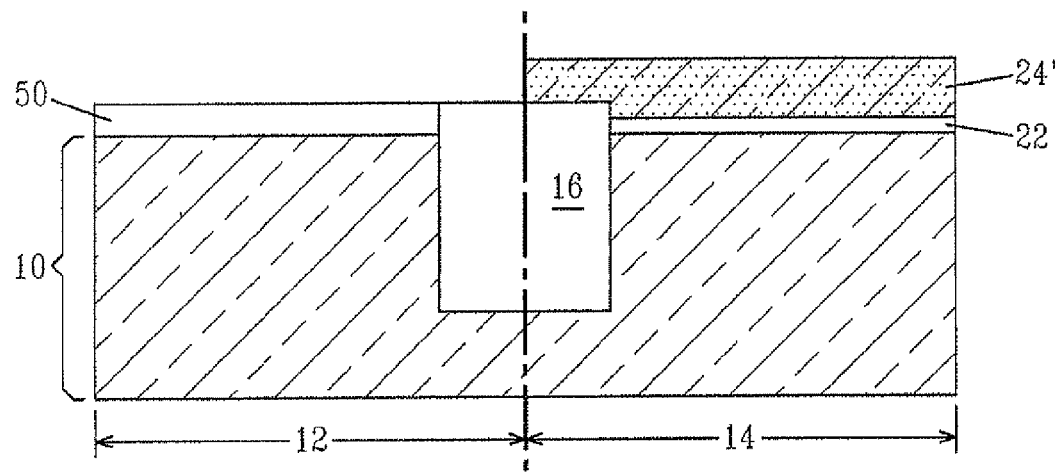

After thinning the Si-containing material, the silicon nitride layer 52 is removed from the nFET device region 12 providing the structure shown, for example, in FIG. 3G. The silicon nitride layer 52 is removed by first forming a silicon oxide layer (not shown) on the surface of the pFET Si structure. The silicon oxide layer is formed by a thermal oxidation. The silicon oxide layer is thin (on the order of about 10 nm or less) and it prevents the Si-containing electrode 24' in the pFET device region 14 from pitting during the SiN removal process. An etching process such as hot phosphoric acid is used to remove the silicon nitride layer 52 from the nFET device region 12.

After removing the silicon oxide layer 50 from the nFET device region utilizing a selective etching process, the processing steps as shown in FIGS. 1H-1L are then performed to provide the semiconductor structure of this embodiment of the present invention.

It is noted that various embodiments of the present invention as described hereinabove, provide a semiconductor structure including a semiconductor substrate 10 that contains at least one nFET device region 12 and at least one pFET device region 14, said device regions are separated by an isolation region 16. In accordance with the present invention, a first dielectric stack (i.e., nFET dielectric stack 28) having a net (i.e., total of all dielectrics) dielectric constant equal to or greater than silicon dioxide is located on a surface of the substrate 10 and within the at least one nFET device region 12 and a second dielectric stack (i.e., pFET dielectric 22) having a net dielectric constant equal to or greater than silicon dioxide located on a surface of the substrate 10 and within the at least one pFET device region 14. Each of the structures provided in the present invention also includes a first gate electrode stack comprising a first metal layer 30 located on either the first dielectric stack or the second dielectric stack and a second gate electrode stack comprising at least a Si-containing electrode 24' and 25 having a thickness of less than 60 nm and an overlying first metal 30 located on the first dielectric stack or the second dielectric stack not include said first gate electrode stack. Preferably, the second gate electrode stack is located in the pFET device region 14, atop the second dielectric stack, and the first gate electrode stack is located atop the first dielectric stack in the nFET device region 12.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing a semiconductor substrate including at least one pFET device region and at least one nFET device region;
   forming a sacrificial layer on an upper surface of said semiconductor substrate in the at least one nFET device region, while leaving the semiconductor substrate in the at least one pFET device region exposed;
   forming a pFET gate dielectric on the exposed semiconductor substrate in the at least one pFET device region, but not in the at least one nFET device region;
   forming a Si-containing electrode having a first thickness in both device regions, wherein a first portion of said Si-containing electrode is located on an upper surface of the sacrificial layer in the at least one nFET device region and a second portion of said Si-containing electrode is located on an upper surface of the pFET gate dielectric in the at least one pFET device region;
   thinning the Si-containing electrode in both device regions to a second thickness, wherein said second thickness is about ½ less than the first thickness;
   removing the thinned first portion of the Si-containing electrode and the sacrificial layer from the at least one nFET device region exposing a portion of the semiconductor substrate, while maintaining the thinned second portion of the Si-containing electrode in the at least one pFET device region;
   forming an nFET dielectric stack on the exposed portion of the semiconductor substrate in the at least one nFET device region, but not in the at least one pFET device region;
   forming a first metal layer in both device regions, wherein a first portion of the first metal layer in the at least one nFET device region is located on an upper surface of the nFET dielectric stack, and a second portion of the first metal layer in the at least one pFET device region is located on an upper surface of the thinned second portion of the Si-containing electrode;
   forming a gate electrode atop the first metal layer in both device regions; and
   patterning to provide at least one nFET gate stack in the at least one nFET device region, and at least one pFET gate stack in the at least one pFET device region, said at least one nFET gate stack comprising, from bottom to top, a patterned portion of the nFET dielectric stack, a patterned first portion of the first metal layer, and a patterned first portion of the gate electrode, and said at least one pFET gate stack comprising, from bottom to top, a patterned portion of the pFET gate dielectric, a patterned second portion of the thinned Si-containing electrode, a patterned second portion of the first metal layer, and a patterned second portion of the gate electrode.

2. The method of claim 1 wherein said nFET dielectric stack comprises an nFET dielectric material and an alkaline earth metal-containing material or a rare earth metal-containing material.

3. The method of claim 2 wherein said alkaline earth metal-containing material has the formula $M_xA_y$, where M is an alkaline earth metal, A is one of O, S or a halide, and x is 1 or 2 and y is 1, 2 or 3.

4. The method of claim 2 wherein said rare earth metal-containing material comprises an oxide or nitride of at least one element from Group IIIB of the Periodic Table of Elements.

5. The method of claim 1 wherein said pFET gate dielectric includes SiON, $SiO_2$ $Al_2O_3$, AlON, AN, a Hf-based dielectric, a Zr-based dielectric, or any combination and multilayer thereof.

6. The method of claim 1 wherein said first metal layer comprises a metal nitride or a metal silicon nitride, wherein said metal is from Group 1VB or VB of the Periodic Table of Elements.

7. The method of claim 1 further comprising selectively forming a second metal layer atop said first metal layer in one of said device regions.

8. The method of claim 1 wherein said thinning of the Si-containing electrode comprises one of planarization, a predictive end point method, counterdoping and selective etching or by deposition.

9. The method of claim 8 wherein said sacrificial layer comprises a silicon nitride polish stop layer which is formed on a silicon oxide layer.

10. The method of claim 1 wherein said Si-containing electrode is doped.

11. A method of fabricating a semiconductor structure comprising:
    providing a semiconductor substrate including at least one pFET device region and at least one nFET device region;
    forming a pFET gate dielectric on the exposed semiconductor substrate in both device regions;
    forming a Si-containing electrode on an upper surface of the pFET gate dielectric in both device regions;

removing the pFET gate dielectric and the Si-containing electrode from the at least one nFET device region, but not the at least one pFET device region;

providing an nFET dielectric stack on an exposed portion of the semiconductor substrate in the at least one nFET device region, but not in the at least one pFET device region;

forming a first metal layer in both device regions, wherein a first portion of the first metal layer in the at least one nFET device region is located on an upper surface of the nFET dielectric stack, and a second portion of the first metal layer in the at least one pFET device region is located on an upper surface of a remaining portion of the Si-containing electrode;

forming a gate electrode atop the first metal layer in both device regions; and patterning to provide at least one nFET gate stack in the at least one nFET device region, and at least one pFET gate stack in the at least one pFET device region, said at least one nFET gate stack comprising, from bottom to top, a patterned portion of the nFET dielectric stack, a patterned first portion of the first metal layer, and a patterned first portion of the gate electrode, and said at least one pFET gate stack comprising, from bottom to top, a patterned portion of the pFET gate dielectric, a patterned portion of the Si-containing electrode, a patterned second portion of the first metal layer, and a patterned second portion of the gate electrode.

12. The method of claim 11 wherein said nFET dielectric stack comprises an nFET dielectric material and an alkaline earth metal-containing material or a rare earth metal-containing material.

13. The method of claim 12 wherein said alkaline earth metal-containing material has the formula $M_xA_y$, where M is an alkaline earth metal, A is one of O, S or a halide, and x is 1 or 2 and y is 1, 2 or 3.

14. The method of claim 12 wherein said rare earth metal-containing material comprises an oxide or nitride of at least one element from Group IIIB of the Periodic Table of Elements.

15. The method of claim 11 wherein said pFET gate dielectric includes SiON, $SiO_2$ $Al_2O_3$, AlON, AN, a Hf-based dielectric, a Zr-based dielectric, or any combination and multilayer thereof.

16. The method of claim 11 wherein said first metal layer comprises a metal nitride or a metal silicon nitride, wherein said metal is from Group IVB or VB of the Periodic Table of Elements.

17. The method of claim 11 further comprising selectively forming a second metal layer atop said first metal layer in one of said device regions.

18. The method of claim 11 wherein said Si-containing electrode is doped.

* * * * *